United States Patent [19]

Grabmaier

[11] 4,341,589
[45] Jul. 27, 1982

[54] METHOD FOR PRODUCING LARGE SURFACE PLATE OR DISC-SHAPED SI CRYSTALS WITH COLUMNAR STRUCTURE

[75] Inventor: Josef Grabmaier, Berg, Fed. Rep. of Germany

[73] Assignee: Siemens Aktiengesellschaft, Berlin and Munich, Fed. Rep. of Germany

[21] Appl. No.: 132,115

[22] Filed: Mar. 20, 1980

[30] Foreign Application Priority Data

Apr. 10, 1979 [DE] Fed. Rep. of Germany ....... 2914506

[51] Int. Cl.³ .............................................. C30B 29/06
[52] U.S. Cl. ........................... 156/606; 156/DIG. 64; 423/348; 23/295 R; 136/258; 148/175; H01L/21/04
[58] Field of Search ................... 156/616 R, DIG. 64, 156/606; 423/348; 23/295 R; 136/258; 65/84; 148/174, 175; 427/95, 86

[56] References Cited

U.S. PATENT DOCUMENTS

| 762,879 | 6/1904 | Chambers | 65/84 |
|---|---|---|---|
| 3,173,765 | 3/1965 | Gobat et al. | 156/606 |
| 3,294,507 | 12/1966 | Borst et al. | 65/84 |
| 3,317,300 | 5/1967 | Prislan | 65/84 |
| 3,804,682 | 4/1974 | Keller | 156/606 |
| 4,264,407 | 4/1981 | Shudo et al. | 156/DIG. 97 |

FOREIGN PATENT DOCUMENTS 2508803 9/1976 Fed. Rep. of Germany .
1539244 1/1974 United Kingdom .

OTHER PUBLICATIONS

Rosenblatt, "Energy Crisis Spurs Development", published in Electronics, Apr. 4, 1974, pp. 99–111.

Primary Examiner—Gregory N. Clements
Attorney, Agent, or Firm—Hill, Van Santen, Steadman, Chiara & Simpson

[57] ABSTRACT

Large surface silicon crystal layers with a columnar structure are produced by directing a plurality of spaced-apart cooling gas streams arranged relative to one another to correspond to a desired columnar structure and positioned a relatively short distance above a free surface of a silicon melt surface located below such system so that a spontaneous seed crystal formation occurs at the regions or areas of the melt immediately below each gas stream and thereafter the affected melt surface is solidified, and then removing the so-formed plate or disc-shaped silicon body from the melt. Dopant material can be incorporated within the so-formed plate or disc-shaped silicon crystal so that a pn-juncture parallel to the surface of such plate or disc is attained.

6 Claims, 1 Drawing Figure

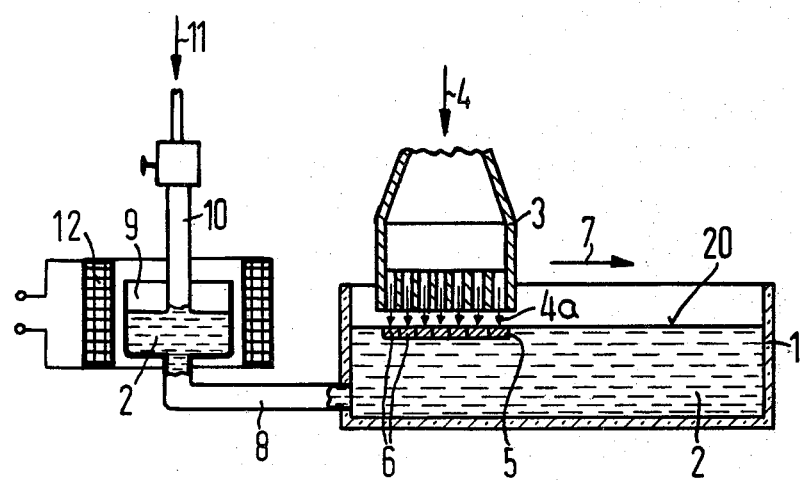

METHOD FOR PRODUCING LARGE SURFACE PLATE OR DISC-SHAPED SI CRYSTALS WITH COLUMNAR STRUCTURE

BACKGROUND OF THE INVENTION

1. Field of the Invention

The invention relates to silicon crystals useful in solar cells and somewhat more particularly to a method and apparatus for producing large surface plate or disc-shaped silicon crystals with columnar structures useful for further processing into solar cells.

2. Prior Art

When solar cells are produced from silicon, the most economically available silicon material should be utilized since the requirement for such component elements relative to crystal quality are not as high as those typically required in producing semiconductor component elements useful in integrated circuits.

Accordingly, it is desirable to find a means of producing silicon crystals which is simple and economical and does not involve excessive loss of materials. Further, such material-wasting and time-consuming steps as, for example, sawing a silicon bar produced by traditional crystal-growth methods, into crystal discs as well as lapping and polishing of such disc surfaces should be eliminated.

German Offenlegungsschrift (hereinafter DT-OS) No. 25 08 803 suggests that plate or disc-shaped silicon crystals having a columnar structure are useful as base materials for producing solar cells whereby an efficiency of more than 10% can be achieved. The process of producing such silicon crystals set forth in this DT-OS generally comprises providing a melt composed of a pre-purified polycrystalline silicon, feeding or casting such melt into a cooled graphite mold of suitable shape and allowing the so-cast melt to solidify in the mold over a temperature gradient. After solidification, the bar-shaped silicon crystals have a columnar structure formed in a direction of the shortest axis of the monocrystalline crystal areas, with crystallographic preferred orientation and exhibit semiconductive properties.

In the manufacture of solar cells from such bar-shaped silicon crystals, crystal discs of about $100 \times 100$ mm$^2$ and a thickness of about 500 μm are sawed from the bars produced in the above described manner with diamond saws conventional in semiconductor technology. Solar cells produced in accordance with known techniques from such discs have an efficiency which fluctuates between about 8.2% at a cell edge, up to 10.5% at the center of the cell. The efficiency thus achieved very nearly matches that of solar cells produced from monocrystalline silicon, which exhibits an efficiency of about 12% to 14%. However, the process described by the above-referenced DT-OS requires a sawing process to divide the bars into discs and such sawing cannot be omitted. Further, the size of the bars is determined by the size of the casting mold required for their manufacturing.

Another process for producing economical silicon is suggested in *Electronics*, page 108, Apr. 4, 1974. With this process, a polycrystalline silicon band having a length of at least 1 meter is produced by casting a silicon melt onto a cooled traveling carrier body composed of molybdenum or onto a traveling band coated with a silicon nitride layer so that the polycrystalline band is produced in a manner somewhat similar to assembly-line principles. However, the resultant silicon material does not have columnar structure so that solar cells produced therefrom exhibit an efficiency of less than about 5%.

Co-pending U.S. patent application Ser. No. 092,636 and Ser. No. 092,637 describe methods and apparatuses for producing plate or disc-shaped silicon bodies with columnar structure. In these applications, the columnar structure in the silicon crystal is attained by casting a silicon melt onto a melt-resistant carrier body having periodically spaced-apart holes or a special mesh structure, through which crystallization seeds for the formation of the desired columnar structures can be positioned or attained.

SUMMARY OF THE INVENTION

The invention provides a method and apparatus for producing large surface silicon crystal plate or discs having columnar structures, which are useful in producing solar cells with increased efficiency. In accordance with the principles of the invention, such large surface plates or discs are produced in a relatively simple manner without the use of specially designed carrier bodies or molds and without requiring sawing, lapping or polishing.

In accordance with the principles of the invention, a cooling gas system, comprised of a controllable cooling gas source interconnected with a number of gas jets arranged to correspond to a desired columnar structure, is positioned above a silicon melt surface so that a plurality of cooling gas streams are directed vertically onto the melt surface and a spontaneous seed crystallization occurs in the melt surface in the regions or areas thereof which are directly opposite the jet openings and the melt surface is then caused to solidify, after which the cooling gas is shut-off and the thus formed plate or disc-shaped silicon crystal is removed from the melt.

In preferred embodiments of the invention, the thickness of the so-formed plate or disc-shaped silicon crystal is controlled by the duration of the action and velocity of the cooling gas streams as well as by the temperature of the melt and of the gas stream. Preferably, the cooling gas comprises an inert gas, such as argon, or hydrogen or mixtures thereof. In certain preferred embodiments of the invention, the desired columnar structure in the formed silicon crystal is attained by utilizing a gas jet system wherein the spacing from one jet center to an adjacent jet center is in the range of about 150 to 3000 μm and most preferably is about 1000 μm. With increased spacing between adjacent jet centers, the columnar structure shifts more and more toward a honeycomb structure.

The attainment of columnar structures or, respectively, honeycomb structures, in the silicon crystals produced in accordance with the principles of the invention can be explained as follows (although other explanation may also be applicable): if a silicon melt is approximately at the melting point of silicon or is in a slightly under-cooled state, then the melt solidifies on its free or upper surface when a cooling gas, from a jet system positioned in relatively close proximity to such melt surface, is blown against the melt surface, in a somewhat similar manner in which a thin ice layer is formed on a surface of water. Because an intensified cooling of the melt surface occurs in the region or area of the melt which is located directly opposite a jet opening, a spontaneous seed formation occurs at such region or area. Further, because the temperature drops within the melt from the melt surface, the crystallization seed grows faster with an orientation perpendicular to the melt surface. In this manner, the formation of columnar structure in the so-crystallized silicon layer necessarily comes about.

In certain preferred embodiments of the invention, pn-junctures are generated parallel to the surface of the plate or disc-shaped silicon crystal before the crystallization process is completed. This is achieved by bringing a suitable dopant to the melt surface during the crystallization process. In an exemplary embodiment, a gaseous dopant of an opposing conductivity type to that in the melt (for example, when n-doping is desired, phosphine can be utilized or when p-doping is desired, borane can be utilized), is blown onto the melt surface and dissolves therein and brings about a corresponding conductivity type. The thickness of the plate or disc-shaped silicon crystal layer is then adjusted so as to be greater than the penetration depth of the dopant. Once the dopant has attained a desired penetration depth, the crystallization of the silicon layer proceeds.

The apparatus embodiment of the invention comprises a combination of a melt tank for containing a silicon melt, a cooling gas system comprised of a number of selectively spaced-apart jets positioned about 2 to 10 mm above the melt surface (which system is positioned above the upper surface of the melt tank and suitably connected to a cooling gas source), a melt reservoir provided with in suitable heating means positioned adjacent the melt tank and in communication therewith so that suitable amounts of silicon melt can be controllably fed to the tank, a solid silicon supply means positioned in operating relation with the melt reservoir to supply solid silicon thereto as necessary and a means for removing the plate or disc-shaped silicon crystal layer formed on the melt surface. In certain embodiments of such apparatus, the means removing the crystallized plate or disc, the means feeding the melt reservoir and the means controlling the cooling gas stream can all be operationally interconnected and controlled by a master control in accordance with a predetermined program.

BRIEF DESCRIPTION OF THE DRAWING

The FIGURE is an elevated, somewhat schematic, cross-sectional view of an embodiment of an apparatus useful in the practice of the invention.

DESCRIPTION OF THE PREFERRED EMBODIMENT

The invention provides a method and apparatus for producing relatively large surface plate or disc-shaped layers or bodies composed of a silicon crystal having a columnar structure, which are useful in the manufacture of solar cells by directing a plurality of spaced-apart cooling gas streams onto an upper or free surface of a silicon melt located a relatively short distance below such streams so that a spontaneous seed crystal formation occurs at the regions or areas of the melt impinged upon by the gas streams and thereafter the affected melt surface is solidified about such seed crystals and then removing the so-formed plate or disc-shaped crystal bodies from the melt.

In the embodiment illustrated in the drawing, a melt tank 1, for example composed of quartz glass, is provided with a silicon melt 2, produced from purified polycrystalline silicon. A cooling jet system 3 is positioned directly over the upper or free surface 20 of the melt 2, at a distance of about 2 to 10 mm away from the surface 20. The jet system 3 is somewhat analogous to a shower head in that it receives a main fluid stream 4 of a cooling gas (from a suitable source, not shown) and sub-divides it into a plurality of spaced-apart sub-streams 4a, which impinge on areas of surface 20 immediately below such streams. The cooling gas can be hydrogen, an inert gas, such as argon, or a mixture of an inert gas and hydrogen. The gas stream 4 is controllable as to temperature, duration of action and velocity via suitable control means (not shown). During operation, a stream of cooling gas 4, for example composed of hydrogen, is blown onto the melt surface 20 in an area thereof beneath system 3 for a relatively short period of time so that the affected melt surface is solidified or crystallized as a relatively thin silicon layer 5. The thickness of such silicon layer 5, which has a column-like growth or columnar structure 6, can be controlled at a given temperature of the silicon melt by regulating the temperature and duration of the cooling gas stream 4, as well as by the velocity with which the cooling gas is blown onto the melt surface 20.

In an exemplary embodiment, the illustrated apparatus was operationally set-up and the parameters thereof adjusted so that the cooling gas velocity was about 30 liters per hour on a square centimeter of melt surface, the temperature of the melt was regulated to be about 1430° C., the temperature of the cooling gas (which in one run was argon and in another run was hydrogen) was adjusted to be about 20° C. and the duration of the gas stream acting on the melt surface was about 1 second. The spacing between adjacent gas streams was about 1000 $\mu$m. Under these exemplary parameters, a 1 mm thick silicon disc was produced during a crystallization period in the order of magnitude of seconds. When the so-produced silicon layer 5 had attained a desired thickness, the cooling gas stream 4 was turned-off and the silicon plate or disc which has crystallized-out was removed from the melt via a drawing means 7, as schematically indicated. Immediately or relatively immediately thereafter, a subsequent silicon plate or disc can be crystallized-out in the same manner.

In certain embodiments, such as that illustrated, a melt reservoir 9 can be operationally connected to the melt tank 1, for example via a suitable conduit 8 so as to supply sufficient molten silicon to the tank 1 to replenish the amount of silicon removed by the crystallization out of the silicon plates or discs. The reservoir 9 can be positioned laterally adjacent the tank 1 and be provided with a means for continuously supplying solid silicon material, for example via a silicon rod 10 controllably fed via feed means 11, into the reservoir, which is maintained at the melting point of silicon via electrical heating means 12 surrounding the reservoir 9. In this manner a relatively continuous process for producing any desired number of silicon plates or discs can be readily attained.

The silicon plates or discs produced in accordance with the principles of the invention are characterized by a high surface planarity and by a high degree of uniformity of the monocrystalline regions thereof. Such silicon plates or discs can be produced in a speedy and direct manner, with any desired layer thickness (up to about 1 mm) so that sawing and polishing processes, as are typically required with conventional methods of producing silicon crystal discs for solar cells, can be eliminated.

Further, pn-junctures can be produced in such plates or discs so as to be parallel to a surface thereof by bringing a select dopant of an opposing conductivity type relative to that of another dopant with the molten silicon into contact with at least the area of the molten silicon surface being affected by the cooling gas streams so that the select dopant penetrates into the melt surface and forms a desired juncture. The thickness of the plate or disc is then adjusted so that it is greater than the penetration depth of such select dopant, which preferably is a gaseous substance.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In a method of producing a relatively large surface silicon crystal plate-shaped body having a columnar crystalline structure and which is useful for manufacture of solar cells, said body being produced through a directional solidification of molten silicon in a silicon melting tank, the improvement comprising:

arranging a cooling gas system comprised of a controllable cooling gas source interconnected with a plurality of gas nozzles in working relation with said silicon melting tank;

positioning said gas nozzles a relatively short distance above a silicon melt surface in said melting tank and arranging said nozzles relative to one another so that spacing between one nozzle center and an adjacent nozzle center corresponds to the diameter of crystallites forming the desired columnar structure;

directing a plurality of cooling gas streams from said cooling gas source through said nozzles and onto the silicon melt surface below such nozzles for a period of time sufficient to attain a desired thickness for said silicon body whereby a substantial spontaneous seed crystal formation occurs in the melt surface in the region thereof lying directly opposite such streams and the area of the melt surface below such streams solidifies about such seed crystals to form columnar crystallite structure; and removing the thus-formed silicon body from said melt surface.

2. In a method as defined in claim 1 wherein a given dopant of one conductivity type is admixed with said silicon melt prior to directing said cooling gas streams onto said melt surface and a dopant of an opposing conductivity type relative to that of said given dopant is admixed with said gas streams before such streams contact said melt surface so that a pn-junction extending parallel to the surface of the formed silicon body results.

3. A method as defined in claim 2 wherein said dopant admixed with said gas streams is a gaseous substance.

4. A method as defined in claim 1 wherein said cooling gas streams are composed of a gas selected from the group consisting of hydrogen, inert gas and mixtures thereof.

5. A method as defined in claim 1 wherein said gas nozzles are arranged so that the spacing between one gas nozzle center and an adjacent gas nozzle center is in the range of about 150 to 3000 $\mu$m.

6. A method as defined in claim 3 wherein said spacing between one gas nozzle center and an adjacent gas nozzle center is about 1000 $\mu$m.

* * * * *